United States Patent
Shindo et al.

(10) Patent No.: US 8,871,144 B2
(45) Date of Patent: Oct. 28, 2014

(54) HIGH-PURITY NI-V ALLOY TARGET THEREFROM HIGH-PURITY NI-V ALLOY THIN FILM AND PROCESS FOR PRODUCING HIGH-PURITY NI-V ALLOY

(75) Inventors: Yuichiro Shindo, Ibaraki (JP); Yasuhiro Yamakoshi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1375 days.

(21) Appl. No.: 10/570,748

(22) PCT Filed: Sep. 8, 2004

(86) PCT No.: PCT/JP2004/013027
§ 371 (c)(1),
(2), (4) Date: Mar. 6, 2006

(87) PCT Pub. No.: WO2005/035809
PCT Pub. Date: Apr. 21, 2005

(65) Prior Publication Data
US 2006/0292028 A1 Dec. 28, 2006

(30) Foreign Application Priority Data
Oct. 7, 2003 (JP) .................................. 2003-348119

(51) Int. Cl.
*C22C 19/03* (2006.01)
*C23C 14/34* (2006.01)

(52) U.S. Cl.
CPC ............. *C23C 14/3414* (2013.01); *C22C 19/03* (2013.01)
USPC ........................................................ 420/441

(58) Field of Classification Search
USPC ........................................................ 420/441
See application file for complete search history.

(56) References Cited

U.S. PATENT DOCUMENTS

| 5,334,267 A | 8/1994 | Taniguchi et al. |
| 5,964,966 A | 10/1999 | Goyal et al. |

(Continued)

FOREIGN PATENT DOCUMENTS

| EP | 0966048 A1 | 2/2001 |
| GB | 2106714 A | 4/1983 |

(Continued)

OTHER PUBLICATIONS

American Sociiety for Metals, Metals,Park, Ohio, Binary Alloy Phase Diagrams, "Ni-V (Nickel-Vanadium)", vol. 2, 1986, pp. 1769 and 1772-1773.*

(Continued)

*Primary Examiner* — Jessee Roe
(74) *Attorney, Agent, or Firm* — Howson & Howson LLP

(57) ABSTRACT

Provided are a high purity Ni—V alloy, high purity Ni—V alloy target and high purity Ni—V alloy thin film wherein the purity of the Ni—V alloy excluding Ni, V and gas components is 99.9 wt % or higher, and the V content variation among ingots, targets or thin films is within 0.4%. With these high purity Ni—V alloy, high purity Ni—V alloy target and high purity Ni—V alloy thin film having a purity of 99.9 wt % or higher, the variation among ingots, targets or thin films is small, the etching property is improved, and isotopic elements such as U and Th that emit alpha particles having an adverse effect on microcircuits in a semiconductor device are reduced rigorously. And further provided is a manufacturing method of such high purity Ni—V alloy capable of effectively reducing the foregoing impurities.

10 Claims, 1 Drawing Sheet

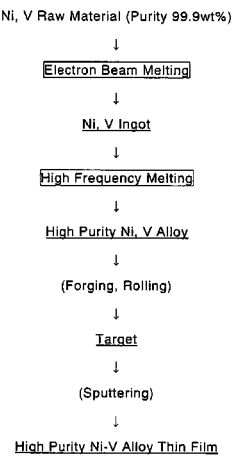

(56) References Cited

U.S. PATENT DOCUMENTS

| | | |
|---|---|---|
| 6,267,827 B1 | 7/2001 | Shindo et al. |
| 6,342,114 B1 | 1/2002 | Lam et al. |
| 6,485,542 B2 | 11/2002 | Shindo et al. |
| 6,669,774 B1 | 12/2003 | Zhang et al. |
| 6,893,732 B1 | 5/2005 | Fritzemeier et al. |
| 7,435,325 B2 | 10/2008 | Shindo et al. |
| 2003/0188426 A1* | 10/2003 | Naugler, Jr. .................. 29/831 |
| 2004/0108028 A1 | 6/2004 | Guo et al. |
| 2004/0256035 A1 | 12/2004 | Yamakoshi et al. |
| 2006/0037680 A1 | 2/2006 | Yamakoshi |
| 2006/0137782 A1 | 6/2006 | Yamakoshi et al. |
| 2007/0074790 A1 | 4/2007 | Yamakoshi et al. |
| 2007/0098590 A1 | 5/2007 | Shindo |
| 2009/0004498 A1 | 1/2009 | Shindo et al. |

FOREIGN PATENT DOCUMENTS

| | | | |
|---|---|---|---|
| JP | 62-040363 | A1 | 2/1987 |
| JP | 11-036065 | A | 2/1999 |
| JP | H11-352310 | A | 12/1999 |
| JP | 2000-169957 | A | 6/2000 |
| JP | 2001-234267 | A | 8/2001 |
| JP | 2001-262328 | A | 9/2001 |
| JP | 2003-213405 | A | 7/2003 |
| WO | 01/08169 | A2 | 2/2001 |

OTHER PUBLICATIONS

ASM International, Materials Park, Ohio, Properties and Selection: Nonferrous Alloys and Special Purpose Materials: "Preparation and Chacterization of Pure Metals", Oct. 1990, vol. 2, pp. 1093-1097.*

W.B. Pearson et al., "The Constitution and Structure of Nickel-Vanadium Alloys in the Region 0-60 At.-% Vanadium", Journal of the Institute of Metals, vol. 80, pp. 641-652, Feb. 1952.

H.A. Moreen et al., "Ni8X Phases in the SYstems Ni-V, Ni-V-Nb, and Ni-V-Ta", Journal of Materials Science, vol. 6, pp. 1452-1432, 1971 (month unknown).

* cited by examiner

Ni, V Raw Material (Purity 99.9wt%)

↓

Electron Beam Melting

↓

Ni, V Ingot

↓

High Frequency Melting

↓

High Purity Ni, V Alloy

↓

(Forging, Rolling)

↓

Target

↓

(Sputtering)

↓

High Purity Ni-V Alloy Thin Film

HIGH-PURITY NI-V ALLOY TARGET THEREFROM HIGH-PURITY NI-V ALLOY THIN FILM AND PROCESS FOR PRODUCING HIGH-PURITY NI-V ALLOY

BACKGROUND OF THE INVENTION

Technical Field

The present invention relates to a high purity Ni—V alloy, high purity Ni—V alloy target and high purity Ni—V alloy thin film wherein the impurity content of Cr, Al and Mg and content of isotopic elements such as U and Th are reduced rigorously, and a purity of the Ni—V alloy is 99.5wt % or higher, as well as to a manufacturing method thereof.

Today, although nickel-vanadium alloy is used as a part of a circuit element in a semiconductor device, in recent years, the circuit size is becoming small pursuant to the miniaturization of the semiconductor circuit. This miniaturization of circuit size requires the design and manufacture of highly sophisticated elements, and further requires the high purification and homogeneity of materials configuring these elements. The nickel-vanadium alloy, as described above, is used as a part of a circuit, but the impurities contained in the nickel-vanadium alloy are in particular becoming a problem.

A particular problem upon forming a microcircuit are the impurities of Cr, Al, Mg and radioactive isotopic elements such as U, Th contained in the nickel-vanadium alloy. Impurities of Cr, Al, Mg affect the etching characteristics (deteriorate the etching speed), and radioactive isotopic elements cause alpha decay and discharge alpha particles.

If the circuit element size is large as in the past, there would be no particular problem. Nevertheless, as described above, even slight amounts of alpha particles in a microcircuit would have an adverse effect on the electronic charge.

Further, upon forming a detailed circuit, improvement of the etching characteristics is a significant problem, and it is necessary that the target material and thin film material have few impurities and have superior uniformity.

As conventional technology, a proposal is made so as to make the alpha emission $10^{-2}$ counts/cm$^2$ per hour or less in a nickel/vanadium sputtering target (c.f. Japanese Patent Laid-Open Publication No. 2000-313954).

Nevertheless, in this case, merely disclosed is a method of mixing raw material nickel having a purity of 99.98% and in which the alpha emission is $10^{-2}$ counts/cm$^2$ per hour or less and raw material vanadium having a purity of 99.5% and in which the alpha emission is $10^{-2}$ counts/cm$^2$ per hour or less, melting this with a vacuum fusion device, and rolling/annealing this to obtain a sputtering target.

In other words, the level of specific content of the individual radioactive isotopic elements to become a problem is still unclear, and there is no specific method (refining method) regarding how to reduce the individual radioactive isotopic elements which may have an adverse effect.

Therefore, conventionally, although it was known that alpha emission would have an effect in a microcircuit, there is a problem in that there is no specific method for reducing the individual radioactive isotopic elements and material for rigorously reducing the individual radioactive isotopic elements.

Further, there is no reference to the effect of impurities of Cr, Al, Mg on the etching characteristics, and such impurities are not even acknowledged as a problem. Nevertheless, uniformity of the material that affects the etching property is being sought upon forming a microcircuit.

SUMMARY OF THE INVENTION

Thus, an object of the present invention is to provide a high purity Ni—V alloy, high purity Ni—V alloy target and high purity Ni—V alloy thin film having a purity of 99.9 wt % or higher, the variation among ingots, targets or thin films is small, the etching property is improved, and isotopic elements such as U and Th that emit alpha particles having an adverse effect on microcircuits in a semiconductor device are reduced rigorously, as well as a manufacturing method of such high purity Ni—V alloy capable of effectively reducing the foregoing impurities.

The present invention provides:

1) A high purity Ni—V alloy, high purity Ni—V alloy target or high purity Ni—V alloy thin film, wherein the purity of the Ni—V alloy excluding Ni, V and gas components is 99.9 wt % or higher, and the V content variation among ingots, targets or thin films is within 0.4%;
2) The high purity Ni—V alloy, high purity Ni—V alloy target or high purity Ni—V alloy thin film according to paragraph 1) above, wherein the impurity content of Cr, Al and Mg is respectively 10 ppm or less;
3) The high purity Ni—V alloy, high purity Ni—V alloy target or high purity Ni—V alloy thin film according to paragraph 1) or paragraph 2) above, wherein the impurity content of U and Th is respectively less than 1 ppb, and the impurity content of Pb and Bi is respectively less than 0.1 ppm;
4) The high purity Ni—V alloy, high purity Ni—V alloy target or high purity Ni—V alloy thin film according to any one of paragraphs 1) to 3) above, wherein the N content as impurities is 1 to 100 wtppm;
5) A manufacturing method of high purity Ni—V alloy wherein either or both the Ni raw material and V raw material having a purity of 99.9 wt % or lower are alloyed by being subject to electron beam melting, and further subject to high frequency melting; and
6) The manufacturing method of high purity Ni—V alloy according to any one of paragraphs 1) to 5) above, wherein either or both the Ni raw material and V raw material having a purity of 99.9 wt % or lower are alloyed by being subject to electron beam melting, and further subject to high frequency melting.

The present invention provides a high purity Ni—V alloy, high purity Ni—V alloy target and high purity Ni—V alloy thin film wherein the impurity content of Cr, Al and Mg and isotopic elements such as U and Th are reduced rigorously, as well as a manufacturing method of such high purity Ni—V alloy capable of effectively reducing the foregoing impurities. The present invention thereby yields a superior effect in that it is capable of facilitating the design of microcircuits by improving the etching property of thin films, which was conventionally a problem, and effectively suppressing the emission of alpha particles that have an adverse effect on microcircuits in the semiconductor device.

BRIEF DESCRIPTION OF THE DRAWINGS

FIG. 1 is a diagram showing the manufacturing flow of a high purity Ni—V alloy.

DETAILED DESCRIPTION OF THE INVENTION

In the present invention, basically, purity of the Ni—V alloy excluding Ni, V and gas components is 99.9 wt % or higher, and the V content variation among alloy ingots, targets or thin films is within 0.4%.

Ordinarily, although a Ni—V alloy is used in a nonmagnetic area, when V is added to Ni, a magnetic body changes to a nonmagnetic body. Specifically, magnetism exists when the V content is roughly 6% or lower, and, when the V content exceeds the foregoing percentage, it is generally considered that the magnetism will disappear. Nevertheless, in reality, there are cases wherein magnetism will remain, although slightly, even when the V content is roughly 6% or higher, for instance, when it is roughly 6 to 7%.

As the cause for this, even with a composition to be used which is thought to be a nonmagnetic body that is sufficient as the target composition, in reality, there is variation in the composition among the manufactured alloy ingots, targets or thin films, and it is considered that this is influencing the characteristics. Therefore, it is necessary to strictly control the variation in the Ni—V alloy, and, if the range of variation is broad, magnetism will occur in the thin film and cause the characteristics to deteriorate.

As shown in the Examples described later, the compositions are adjusted and melted so as to achieve an alloy ratio of Ni-7.2 wt % V, and it is necessary to strictly control the fluctuation in the characteristics by making the composition variation among alloy ingots, targets or thin films to be within 0.4%.

Further, if the additive amount of V increases, there is a problem in that the intermetallic compound of $Ni_8V$ will be subject to deposition. This $Ni_8V$ intermetallic compound will be subject to deposition when V is roughly 8% or higher. Deposition of this $Ni_8V$ intermetallic compound will significantly change the mechanical properties, become foreign matter in the target, and cause the generation of particles during sputtering deposition.

Further, in the case of a Ni—V alloy, there is predisposition that the etching characteristics will also change significantly pursuant to the increase in the V volume. In other words, since the etching characteristics will change significantly even with fluctuation that slightly exceeds ±0.4%, there is a problem in that a predetermined film thickness cannot be obtained.

This means that, in addition to adjusting the target composition, it is also extremely important to reduce the composition variation among alloy ingots, targets or thin films and to keep it within at least ±0.4%.

As described above, with a Ni—V alloy, even a slight fluctuation in the V volume will largely affect the characteristics, and the strict control of the composition variation that was conventionally overlooked has an extremely significant meaning in the present alloy composition.

Further, the impurity content of Cr, Al and Mg that will aggravate the etching property is made to be 10 ppm or less, the impurity content of U and Th is respectively made to be less than 1 ppb, the impurity content of Pb and Bi is respectively made to be less than 0.1 ppm, and the isotopic elements of U and Th that cause α emission are reduced vigorously.

Moreover, it is desirable to make the N content as impurities to be 1 to 100 wtppm. This is because when the N content increases, the etching characteristics will become unstable. In addition, it is also desirable that there is no variation of these impurities among targets and alloy lots.

When the impurity content of Cr, Al and Mg in the Ni—V alloy exceeds 10 ppm, the etching property will aggravate and, for example, will affect the formation of a circuit. Further, when the impurity content of U and Th respectively becomes 1 ppb or more or the impurity content of Pb and Bi respectively becomes 0.1 ppm or more, with a microcircuit, even slight amounts of alpha particles will have an adverse effect on the electronic charge and cause a malfunction. Thus, it is desirable to limit the foregoing impurities within the range described above.

Upon manufacturing a high purity Ni—V alloy, Ni raw material and V raw material respectively having a purity of 99 wt % are refined with electrolytic refining in order to obtain electrodeposited Ni and electrodeposited V. Next, at the first stage, either or both the electrodeposited Ni and electrodeposited V are subject to electron beam melting, and, at the subsequent second stage, these are further subject to high frequency melting and then alloyed. Upon performing high frequency melting, it is desirable to use a calcia crucible.

Thereby, it is possible to make the impurity content of Cr, Al and Mg to be 10 ppm or less, the impurity content of U and Th to be respectively less than 1 ppb, and the impurity content of Pb and Bi to be respectively less than 0.1 ppm.

As a result of subjecting the foregoing raw materials to electron beam melting and high frequency melting for alloying, the refined high purity Ni—V alloy ingot can be subject to forging and rolling so as to form a sputtering target.

Further, as a result of sputtering this high purity Ni—V alloy sputtering target, it is possible to reduce the impurity content of Cr, Al and Mg and improve the etching property, and to form a high purity Ni—V alloy thin film in which the α emission is significantly reduced.

FIG. 1 shows the manufacturing flow of the Ni—V alloy of the present invention.

EXAMPLES

Examples of the present invention are now explained. These Examples are merely illustrative, and the present invention shall in no way be limited thereby. In other words, the present invention shall only be limited by the scope of the present invention, and shall include the various modifications other than the Examples of this invention.

Example 1

Ni raw material having a purity level of 99% was subject to electrolytic refining with sulfate bath at pH2 and room temperature in order to obtain electrodeposited Ni having a purity of 99.99%. Meanwhile, V raw material having a purity level of 99.5% was subject to molten salt electrolysis (NaCl-KCl-VCl$_2$ bath, 750° C.) in order to obtain electrodeposited V. Next, these were respectively subject to electron beam melting in order to obtain Ni and V ingots having a purity of 99.99%.

These were respectively weighted, and 30 Kg was subject to high frequency melting so as to achieve an alloy ratio of Ni-7.2 wt % V. In addition, Analytical values of impurities of the Ni raw material, V raw material and Ni—V alloy ingot after dissolution are shown in Table 1.

As shown in Table 1, after electron beam melting and high frequency melting, impurities respectively became Cr: 1 wtppm, Al: 2 wtppm, Mg: 1 wtppm, U: <0.1 wtppb, Th: <0.1 wtppb, Pb: <0.1 wtppm, Bi: <0.1 wtppm, N: <10 wtppm, and the purity improved (purity of 99.999%).

Further, this was subject to rolling at room temperature in order to obtain a target having a size of φ320×6 mmt. Moreover, this target was sputtered under Ar decompression in order to form a thin film. In addition, after forming the thin film, influence of etching characteristics and alpha particle emission having an adverse effect on the microcircuit in a semiconductor device was examined. Further, variation among the targets (10 types) cut out from the foregoing Ni—V alloy ingot was also examined. The results are shown in Table 2.

As a result, as shown in Table 2, the V variation reduced, the N volume reduced, the etching characteristics improved, there were hardly any alpha particles, and the influence of alpha particle emission reduced significantly.

As described above, it is evident that the high purity Ni—V alloy according to the present invention is extremely effective when manufacturing a semiconductor device.

TABLE 1

|  | Cr | Al | Mg | U | Th | Pb | Bi | N | Purity |
|---|---|---|---|---|---|---|---|---|---|
| Ni Raw Material | 300 | 100 | 60 | 300 | 100 | 100 | 60 | 100 | 99.9 |
| V Raw Material | 800 | 550 | 300 | 1100 | 1050 | 750 | 100 | 700 | 99.0 |
| Example 1 | 1 | 2 | 1 | <0.1 | <0.1 | <0.1 | <0.1 | <10 | 99.999 |

U, Th: wtppb; Cr, Al, Mg, Pb, Bi, N: wtppm; Purity: wt %

TABLE 2

(Difference: Difference of Maximum Value and Minimum Value)

|  | 1 | 2 | 3 | 4 | 5 | 6 | 7 | 8 | 9 | 10 | Difference |
|---|---|---|---|---|---|---|---|---|---|---|---|
| V(%) | 7.20 | 7.17 | 7.19 | 7.21 | 7.18 | 7.21 | 7.22 | 7.18 | 7.23 | 7.24 | 0.07 |
| N(ppm) | 30 | 20 | 30 | 40 | 30 | 30 | 20 | 30 | 20 | 20 | — |

Example 2

Ni raw material having a purity level of 99.9% and V raw material having a purity level of 95% were prepared. The Ni raw material was used as is, and only the V raw material was subject to molten salt electrolysis (NaCl-KCl-$VCl_2$ bath, 750° C.) in order to obtain electrodeposited V. Next, this was subject to electron beam melting in order to obtain a V ingot having a purity of 99.99%.

These were respectively weighted, and 30 Kg was subject to high frequency melting so as to achieve an alloy ratio of Ni-7.2 wt % V. Analytical values of impurities of the Ni raw material, V raw material and Ni—V alloy ingot after dissolution are shown in Table 3.

As shown in Table 3, after electron beam melting and high frequency melting, impurities respectively became Cr: 9 wtppm, Al: 10 wtppm, Mg: 7 wtppm, U: wtppb, Th: 1 wtppb, Pb: <0.1 wtppm, Bi: <0.1 wtppm, N: 30 wtppm, and the purity improved (purity of 99.995%).

Further, this was subject to rolling at room temperature in order to obtain a target having a size of φ320×6 mmt. Moreover, this target was sputtered under Ar decompression in order to form a thin film. In addition, after forming the thin film, influence of etching characteristics and alpha particle emission having an adverse effect on the microcircuit in a semiconductor device was examined. Further, variation among the targets cut out from the foregoing Ni—V alloy ingot and N volume were also examined. The results are shown in Table 4.

As a result, as shown in Table 4, although the V variation increased slightly in comparison to Example 1, it was within the tolerance level. Further, the N volume was also within the scope of the present invention, and the etching characteristics were favorable. Moreover, there were hardly any alpha particles, and the influence of alpha particle emission reduced significantly. As described above, it is evident that the high purity Ni—V alloy according to the present invention is extremely effective when manufacturing a semiconductor device.

TABLE 3

|  | Cr | Al | Mg | U | Th | Pb | Bi | N | Purity |
|---|---|---|---|---|---|---|---|---|---|
| Ni Raw Material | 7 | 6 | 3 | 1 | 1 | 5 | 3 | 30 | 99.9 |
| V Raw Material | 500 | 40000 | 100 | 250 | 550 | 1000 | 300 | 1000 | 95.0 |
| Example 2 | 9 | 10 | 7 | 1 | 1 | <0.1 | <0.1 | 30 | 99.995 |

U, Th: wtppb; Cr, Al, Mg, Pb, Bi, N: wtppm; Purity: wt %

TABLE 4

(Difference: Difference of Maximum Value and Minimum Value)

|  | 1 | 2 | 3 | 4 | 5 | 6 | 7 | 8 | 9 | 10 | Difference |
|---|---|---|---|---|---|---|---|---|---|---|---|
| V(%) | 7.10 | 7.22 | 7.25 | 7.28 | 7.20 | 7.15 | 7.11 | 7.28 | 7.10 | 7.25 | 0.18 |
| N(ppm) | 90 | 20 | 30 | 10 | 20 | 50 | 100 | 40 | 70 | 5 | — |

Example 3

Ni raw material having a purity level of 99% was subject to electrolytic refining with sulfate bath at pH2 and room temperature in order to obtain electrodeposited Ni having a purity of 99.99%. Next, this was subject to electron beam melting in order to obtain a Ni ingot having a purity of 99.99%. Meanwhile, V raw material having a purity level of 99.95% was used as is.

These were respectively weighted, and 30 Kg was subject to high frequency melting so as to achieve an alloy ratio of Ni-7.2 wt % V. Analytical values of impurities of the Ni raw material, V raw material and Ni—V alloy ingot after dissolution are shown in Table 5.

As shown in Table 5, after electron beam melting and high frequency melting, impurities respectively became Cr: 5 wtppm, Al: 8 wtppm, Mg: 6 wtppm, U: 2 wtppb, Th: 1 wtppb, Pb: 1 wtppm, Bi: 1 wtppm, N: 70 wtppm, and the purity improved (purity of 99.995%).

Further, this was subject to rolling at room temperature in order to obtain a target having a size of ϕ320×6 mmt. Moreover, this target was sputtered under Ar decompression in order to form a thin film. In addition, after forming the thin film, influence of etching characteristics and alpha particle emission having an adverse effect on the microcircuit in a semiconductor device was examined.

Further, variation among the targets cut out from the foregoing Ni—V alloy ingot was also examined. The results are shown in Table 6.

As a result, as shown in Table 6, the V variation reduced, the N volume reduced, the etching characteristics improved, there were hardly any alpha particles, and the influence of alpha particle emission reduced significantly. As described above, it is evident that the high purity Ni—V alloy according to the present invention is extremely effective when manufacturing a semiconductor device.

TABLE 5

|                 | Cr  | Al  | Mg | U   | Th  | Pb  | Bi | N   | Purity |
|-----------------|-----|-----|----|-----|-----|-----|----|-----|--------|
| Ni Raw Material | 300 | 100 | 60 | 300 | 100 | 100 | 60 | 100 | 99.0   |
| V Raw Material  | 70  | 10  | 10 | 10  | 10  | 15  | 12 | 100 | 99.95  |
| Example 3       | 5   | 8   | 6  | 2   | 1   | 1   | 1  | 70  | 99.995 |

U, Th: wtppb; Cr, Al, Mg, Pb, Bi, N: wtppm; Purity: wt %

TABLE 6

(Difference: Difference of Maximum Value and Minimum Value)

|        | 1    | 2    | 3    | 4    | 5    | 6    | 7    | 8    | 9    | 10   | Difference |
|--------|------|------|------|------|------|------|------|------|------|------|------------|
| V(%)   | 7.23 | 7.15 | 7.13 | 7.26 | 7.23 | 7.20 | 7.18 | 7.25 | 7.16 | 7.19 | 0.12       |
| N(ppm) | 30   | 20   | 30   | 40   | 30   | 30   | 20   | 30   | 20   | 20   | —          |

Comparative Example 1

Ni raw material and V raw material having a purity of 99% were weighed without change, and 30 Kg was subject to high frequency melting so as to achieve an alloy ratio of Ni-7.2 wt % V.

During dissolution, large amounts of gas were generated, and splash occurred frequently. Analytical values of impurities of the Ni raw material, V raw material and Ni—V alloy ingot after dissolution are shown in Table 7.

As shown in Table 7, after electron beam melting and high frequency melting, the purity became 99%, and it is evident that there is a large content of Cr, Al and Mg, and there is also a large content of U, Th, Pb and Bi that emit α particles.

Further, splash occurred frequently, it was difficult to control the composition, and V and N variation among lots also became great.

Further, this was subject to rolling at room temperature in order to obtain a target having a size of φ320×6 mmt. Moreover, this target was sputtered under Ar decompression in order to form a thin film. In addition, after forming the thin film, influence of etching characteristics and alpha particle emission having an adverse effect on the microcircuit in a semiconductor device was examined.

Further, variation among the targets cut out from the foregoing Ni—V alloy ingot was also examined. The results are shown in Table 8.

As a result, as shown in Table 8, V variation was significant, N volume increased, and the etching characteristics deteriorated. Moreover, the amount of U, Th and the like that emit alpha particles that have an adverse effect on a microcircuit also increased.

TABLE 7

|  | Cr | Al | Mg | U | Th | Pb | Bi | N | Purity |
|---|---|---|---|---|---|---|---|---|---|
| Ni Raw Material | 300 | 100 | 60 | 300 | 100 | 100 | 60 | 100 | 99.0 |
| V Raw Material | 800 | 550 | 300 | 1100 | 1050 | 750 | 100 | 700 | 99.0 |
| Comparative Example 1 | 350 | 120 | 70 | 380 | 200 | 120 | 70 | 150 | 99.0 |

U, Th: wtppb; Cr, Al, Mg, Pb, Bi, N: wtppm; Purity: wt %

TABLE 8

(Difference: Difference of Maximum Value and Minimum Value)

| | 1 | 2 | 3 | 4 | 5 | 6 | 7 | 8 | 9 | 10 | Difference |
|---|---|---|---|---|---|---|---|---|---|---|---|
| V(%) | 6.8 | 7.5 | 6.9 | 7.8 | 7.3 | 7.5 | 7.0 | 7.2 | 7.7 | 6.7 | 1.1 |
| N(ppm) | 150 | 100 | 130 | 180 | 120 | 250 | 110 | 160 | 130 | 190 | — |

Comparative Example 2

The same raw materials used in Example 1; that is, Ni raw material having a purity level of 99% and V raw material having a purity level of 99.5% were weighed so as to achieve an alloy ratio of Ni-7.2 wt % V, and this was subject to electron beam melting in order to obtain a Ni—V alloy ingot.

Analytical values of impurities of the Ni—V alloy ingot are shown in Table 9. Purity of this alloy was 99.9%.

This was subject to rolling at room temperature in order to obtain a target having a size of φ320×6 mmt. Moreover, this target was sputtered under Ar decompression in order to form a thin film. In addition, after forming the thin film, influence of etching characteristics and alpha particle emission having an adverse effect on the microcircuit in a semiconductor device was examined.

Further, variation among the targets cut out from the foregoing Ni—V alloy ingot was also examined. The results are shown in Table 10.

As a result, as shown in Table 10, V variation among targets was significant, N volume increased, and the etching characteristics deteriorated. Moreover, the amount of U, Th and the like that emit alpha particles that have an adverse effect on a microcircuit also increased.

TABLE 9

|  | Cr | Al | Mg | U | Th | Pb | Bi | N | Purity |
|---|---|---|---|---|---|---|---|---|---|
| Ni Raw Material | 7 | 6 | 3 | 1 | 1 | 5 | 3 | 30 | 99.9 |
| V Raw Material | 500 | 40000 | 100 | 250 | 550 | 1000 | 300 | 1000 | 95.0 |
| Comparative Example 2 | 12 | 80 | 10 | 12 | 36 | 32 | 15 | 100 | — |

U, Th: wtppb; Cr, Al, Mg, Pb, Bi, N: wtppm; Purity: wt %

TABLE 10

(Difference: Difference of Maximum Value and Minimum Value)

|  | 1 | 2 | 3 | 4 | 5 | 6 | 7 | 8 | 9 | 10 | Difference |
|---|---|---|---|---|---|---|---|---|---|---|---|
| V(%) | 7.3 | 8.1 | 7.9 | 8.5 | 7.6 | 7.4 | 8.3 | 8.0 | 7.7 | 7.9 | 1.2 |
| N(ppm) | 80 | 90 | 130 | 50 | 80 | 60 | 140 | 50 | 90 | 100 | — |

The present invention provides a high purity Ni—V alloy, high purity Ni—V alloy target and high purity Ni—V alloy thin film wherein the impurity content of Cr, Al and Mg is reduced so as to improve the etching property, and isotopic elements such as U and Th are reduced rigorously, as well as a manufacturing method of such high purity Ni—V alloy capable of effectively reducing the foregoing impurities. Thereby, since the variation among alloys, targets or thin films is small, the etching property is superior, and an adverse effect caused by alpha emission is not inflicted upon designing a microcircuit, the present invention is extremely effective in forming a circuit of a highly sophisticated semiconductor device.

The invention claimed is:

1. A high purity nickel-vanadium alloy sputtering target for depositing thin films forming microcircuits of semiconductor devices, comprising:
   a sputtering target body consisting of a non-magnetic Ni—V alloy having 7.2 wt % V that provides stable etching characteristics and that suppresses alpha emissions, said sputtering target body not including $Ni_8V$ intermetallic compound and having a structure formed by forging and rolling;
   said Ni—V alloy having a purity, excluding gas components, of at least 99.995 wt %, a variation of V content within 0.4%, an impurity content of 10 ppm or less of each of Cr, Al and Mg, and an impurity content of 1 ppb or less of each of U and Th.

2. A high purity nickel-vanadium alloy sputtering target according to claim 1, wherein said Ni—V alloy has an impurity content of Pb of less than 0.1 ppm and an impurity content of Bi of less than 0.1 ppm.

3. A high purity nickel-vanadium alloy sputtering target according to claim 2, wherein said Ni—V alloy has an impurity content of N of 1 to 100 wtppm.

4. A high purity nickel-vanadium alloy sputtering target according to claim 1, wherein said Ni—V alloy consists of said 7.2 wt % V, impurities, and a remainder of Ni.

5. A high purity nickel-vanadium alloy sputtering target according to claim 4, wherein said sputtering target body is of a size of φ320×6 mmt.

6. A high purity nickel-vanadium alloy thin film deposited from a sputtering target onto a substrate, comprising:
   a thin film forming part of a microcircuit of a semiconductor device, said thin film consisting of a non-magnetic Ni—V alloy having 7.2 wt % V that provides stable etching characteristics, that suppresses alpha emissions, and that does not contain $Ni_8V$ intermetallic compound;
   said Ni—-V alloy having a purity, excluding gas components, of at least 99.995 wt %, a variation of V content within 0.4%, a content of 10 ppm or less of each of Cr, Al and Mg, and a content of 1 ppb or less of each of U and Th.

7. A high purity nickel-vanadium alloy thin film according to claim 6, wherein said Ni—-V alloy has a content of Pb of less than 0.1 ppm and a content of Bi of less than 0.1 ppm.

8. A high purity nickel-vanadium alloy thin film according to claim 7, wherein said Ni—V alloy has a content of N of 1 to 100 wtppm.

9. A high purity nickel-vanadium alloy thin film according to claim 6, wherein said thin film consists of said 7.2 wt % V, impurities, and a remainder of Ni.

10. A high purity nickel-vanadium alloy sputtering target for depositing thin films forming microcircuits of semiconductor devices, comprising:
   a sputtering target body consisting of a Ni—V alloy that provides stable etching characteristics and that suppresses alpha emissions, said sputtering target body having a structure formed by forging and rolling;
   said Ni—V alloy having a purity, excluding gas components, of at least 99.995 wt %, a variation of V content within 0.4%, an impurity content of 10 ppm or less of each of Cr, Al and Mg, and an impurity content of 1 ppb or less of each of U and Th.

* * * * *